United States Patent [19]
Albert, Jr.

[11] 3,930,644
[45] Jan. 6, 1976

[54] PRINTED CIRCUIT BOARD CARRIER

[75] Inventor: Eugene V. Albert, Jr., Overland Park, Kans.

[73] Assignee: Q Corporation, Overland Park, Kans.

[22] Filed: Dec. 26, 1974

[21] Appl. No.: 536,451

[52] U.S. Cl. .... 269/118; 269/254 CS; 269/321 WE
[51] Int. Cl.² .................... B25B 5/02; B25B 5/14
[58] Field of Search ....... 269/55, 56, 111, 118, 119, 269/120, 121, 203, 254 CS, 287, 321 WE; 29/203 B, 203 J; 228/36, 37

[56] References Cited
UNITED STATES PATENTS

| | | | |
|---|---|---|---|
| 3,577,682 | 5/1971 | Kulischenko | 269/321 WE X |
| 3,600,746 | 8/1971 | Kostur | 269/119 X |
| 3,662,456 | 5/1972 | Walter | 29/203 J |
| 3,680,762 | 8/1972 | Kondo | 228/36 X |
| 3,775,644 | 11/1973 | Cotner | 269/321 WE X |
| 3,848,864 | 11/1974 | Dwyer | 269/46 |

FOREIGN PATENTS OR APPLICATIONS

| | | | |
|---|---|---|---|
| 19,722 | 1/1915 | Denmark | 269/119 |
| 585,599 | 11/1958 | Italy | 269/111 |

*Primary Examiner*—Al Lawrence Smith
*Assistant Examiner*—Nicholas P. Godici
*Attorney, Agent, or Firm*—Fishburn, Gold & Litman

[57] ABSTRACT

A carrier adjustable in size for holding various sized printed circuit boards during manufacturing procedures including installation of components fluxing, soldering, trimming and the like and includes a frame having conveyor engaging members mounted thereon. Laterally spaced carrier side members are adjustably supported on the frame and are adapted to support respective side edge portions of the printed circuit board. Longitudinally spaced carrier end members are adjustably supported on the frame and are adapted to support respective end edge portions of the printed circuit board. The conveyor engaging members of the frame are adapted to support the carrier on a support surface and to permit vertical stacking of like carriers.

12 Claims, 8 Drawing Figures

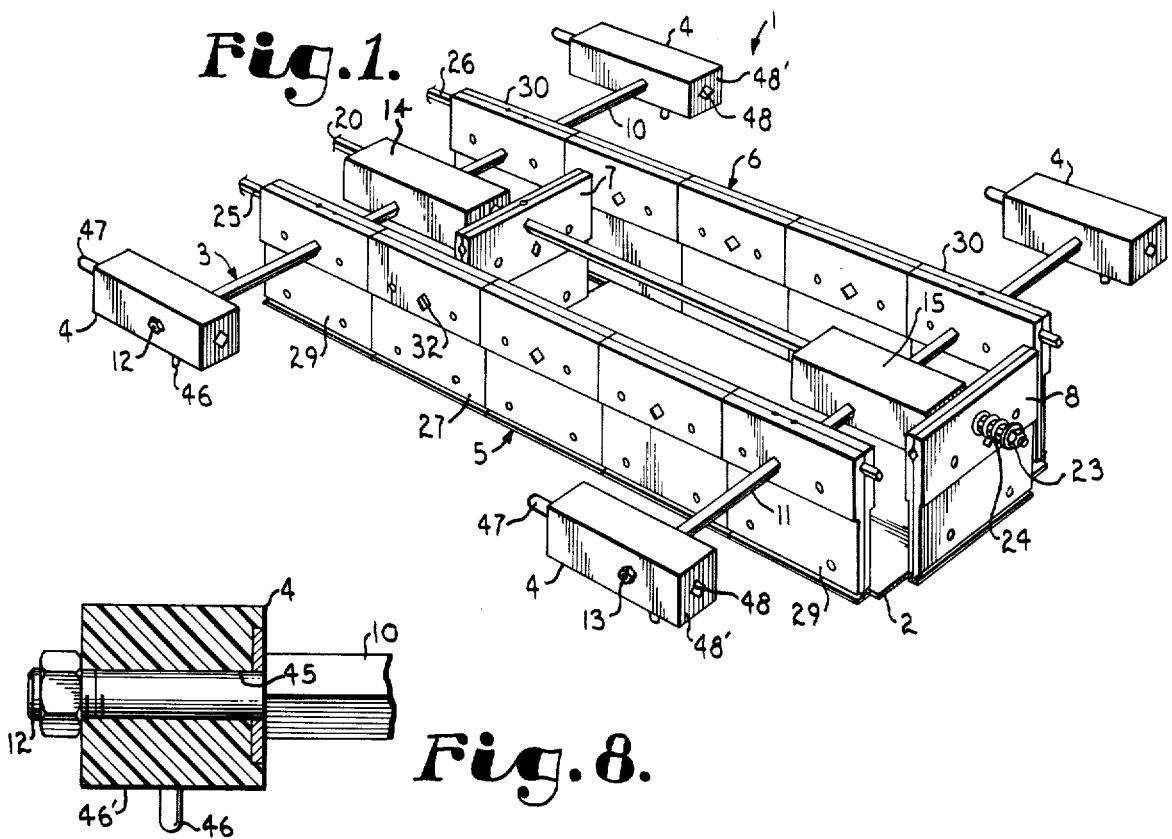
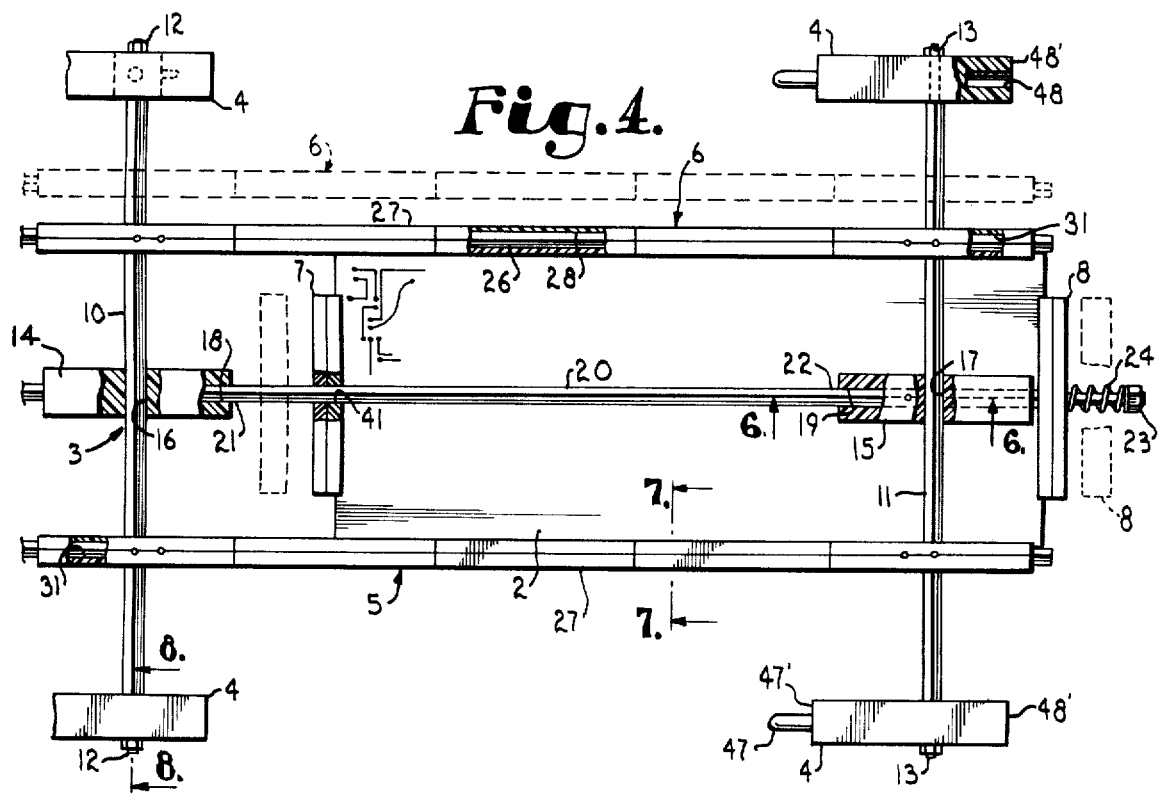

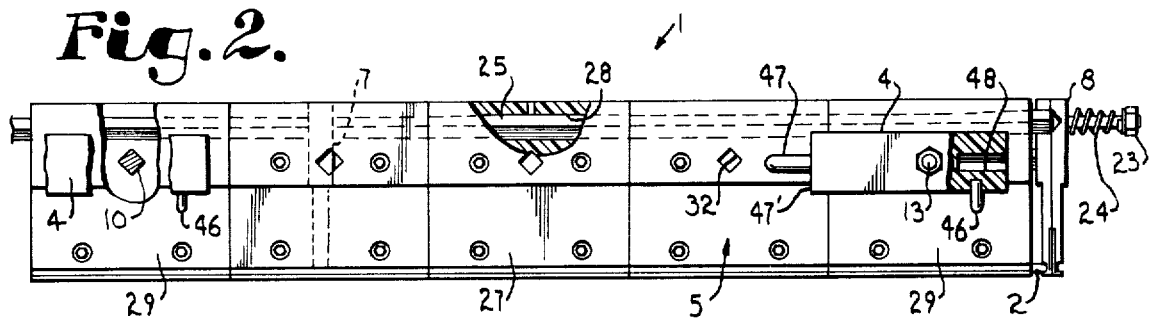
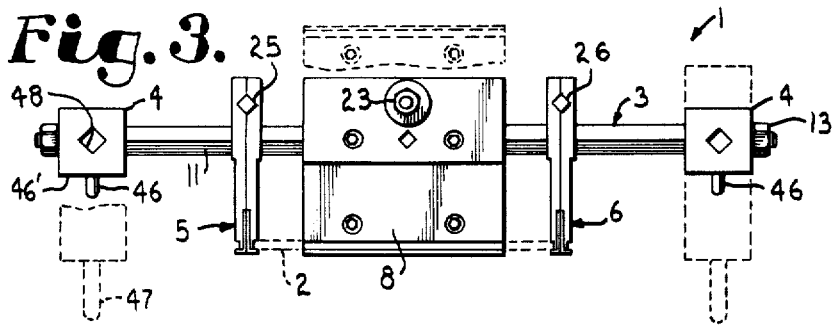
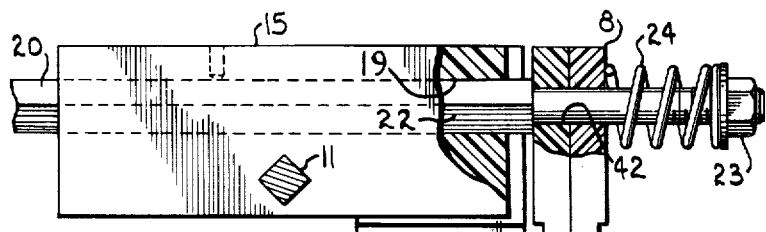
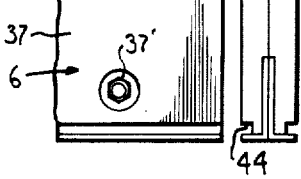
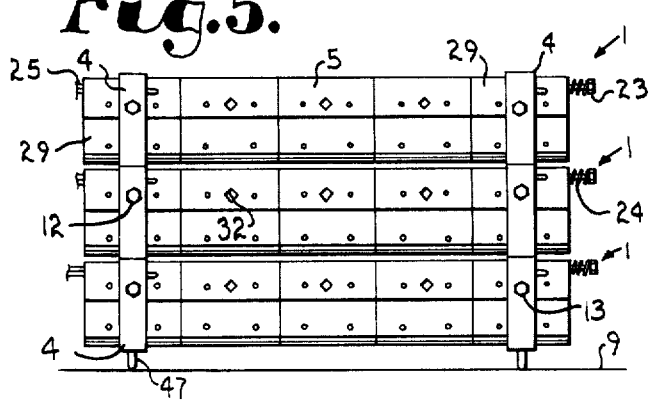
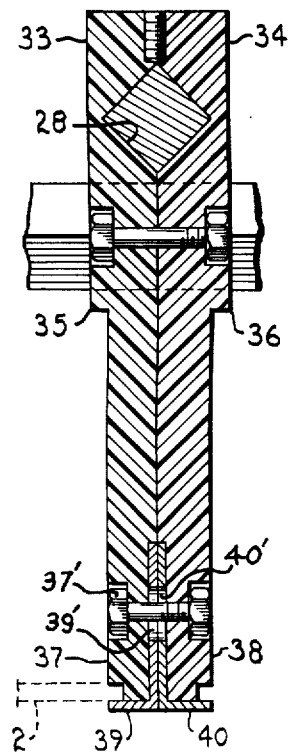

PRINTED CIRCUIT BOARD CARRIER

The present invention relates to printed circuit board carriers and more particularly to such a carrier having adjustable portions for holding a printed circuit board during movement of the carrier and board along a conveyor during assembly of components and other manufacturing operations and for storage.

The principal objects of the present invention are: to provide a printed circuit board carrier having adjustable portions for holding a printed circuit board during assembly of components thereon and other manufacturing operations and storage thereof; to provide such a carrier having conveyor engaging members for removably mounting the carrier on a conveyor for movement to each of a plurality of stations during manufacturing operations on the printed circuit board; to provide such a carrier adapted to stack vertically with a plurality of like carriers for storage of the like carriers and moving a plurality of like carriers; to provide such a carrier constructed to permit quick installation of and removal of the printed circuit board therefrom; to provide such a carrier which is quickly adjustable to the peripheral size of the respective printed circuit board; to provide such a carrier having side members formed of a plurality of like modular blocks each having equal longitudinal dimension to thereby permit selective varying of the length of the carrier; to provide such a carrier adapted to securely hold the board during precise manufacturing operations, such as applying solder, trimming conductor leads, and the like; and to provide such a carrier which is economical to manufacture, durable in construction, positive in operation, and particularly well adapted for the proposed use.

Other objects and advantages of this invention will become apparent from the following description taken in connection with the accompanying drawings wherein are set forth, by way of illustration and example, certain embodiments of this invention.

The drawings constitute a part of the specification and include an exemplary embodiment of the present invention and illustrate various objects and features of the printed circuit board carrier.

FIG. 1 is a perspective view of a printed circuit board carrier embodying features of the present invention.

FIG. 2 is a side elevational view of the carrier with portions broken away to better illustrate component parts thereof.

FIG. 3 is an end elevational view of the carrier with certain components of the carrier shown in respective alternate positions.

FIG. 4 is a top plan view of the carrier with portions broken away to better illustrate component parts thereof.

FIG. 5 is a side elevational view of a plurality of like carriers stacked vertically.

FIG. 6 is an enlarged fragmentary sectional view taken on line 6—6, FIG. 4 and showing one carrier end member.

FIG. 7 is an enlarged fragmentary sectional view taken on line 7—7, FIG. 4 and showing a carrier side member.

FIG. 8 is an enlarged fragmentary sectional view taken on line 8—8, FIG. 4 and showing a conveyor engaging portion.

Referring more in detail to the drawings:

As required, detailed embodiments of the present invention are disclosed herein, however, it is to be understood that the enclosed embodiments are merely exemplary of the invention which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure.

In the disclosed embodiment of the present invention, the reference numeral 1 generally designates a carrier for holding a printed circuit board 2 during manufacturing operations and storage thereof. The carrier 1 includes a frame 3 having conveyor engaging and support members 4 mounted thereon. Laterally spaced side carrier members 5 and 6 are adjustably supported on the frame 3 and are adapted when properly adjusted to support respective side edge portions of the printed circuit board 2. Longitudinally space carrier end members 7 and 8 are adjustably supported on the frame 3 and are adapted when properly adjusted to grip and support respective end edge portions of the printed circuit board 2. The conveyor engaging members 4 of the frame 3 are adapted to support the carrier 1 on a suitable support surface 9 and to permit vertical stacking of a plurality of like carriers 1.

The illustrated frame 3 includes longitudinally spaced leading and trailing frame end members 10 and 11 respectively. The end members 10 and 11 extend transversely of the path of travel of the carrier 1 when moving along a conveyor (not shown), such as for movement to each of a plurality of stations during manufacturing operations on the printed circuit board 2. The frame end members 10 and 11 are each elongated members having a non-round cross section illustrated as being square. The frame end members 10 and 11 respectively each have opposite end portions 12 and 13 that are round in cross section, for length to serve as bearing members for supporting respective support members 4 thereon.

The frame 3 includes leading and trailing center connectors or support members 14 and 15 mounted on the frame end members 10 and 11 respectively. The support members 14 and 15 may be fixed thereon or adjustably mounted on the end members 10 and 11 respectively. In the illustrated structure, the support members 14 and 15 have non-round passages 16 and 17 respectively extending transversely therethrough. The passages 16 and 17 have a corresponding shape to the non-round shape of the end members 10 and 11 respectively and the support members 14 and 15 are suitably secured to the end members 10 and 11 respectively, as by set screws.

The leading and trailing support members 14 and 15 have non-round passages 18 and 19 respectively extending longitudinally therethrough and adapted to receive therein respective portions of a center beam member 20 of the frame 3.

The beam member 20 is illustrated as an elongated member having a non-round cross section with opposite end portions 21 and 22 thereof extending through the non-round passages 18 and 19 in the support members 14 and 15 respectively whereby the support members 14 and 15 are movable longitudinally along the beam member 20. The support members 14 and 15 are suitably secured to the center beam member 20, as by set screws, to determine the longitudinal spacing between the leading and trailing end members 10 and 11 of the frame 3. The beam member 20 extends through the support member 15 and has the non-round portion thereof extending rearwardly thereof for a distance less the thickness of the end member 8 and then has a portion 22 of round cross section for a length thereof with an enlarged end member or collar 23 mounted thereon and a resilient member or coil spring 24 is sleeved on the portion 22, for a purpose later described.

The carrier side members 5 and 6 are preferably of modular form and are adjustably mounted on the frame end members 10 and 11 and are movable toward and away from the beam member 20. The carrier side members 5 and 6 include elongated bars 25 and 26 respectively each having a non-round cross section. A plurality of like blocks 27 each having an equal longitudinal dimension are mounted on and movable along each of the bars 25 and 26. The blocks 27 each have a longitudinal passage 28 therethrough of a non-round cross section corresponding to the cross section of the bars 25 and 26. The side members 5 and 6 each include blocks 29 and 30 mounted at the ends thereof and each having a longitudinal dimension equal to that of the blocks 27 mounted between the like or modular block 29 and 30. The blocks 29 and 30 each have a longitudinal passage 31 therethrough and of a shape corresponding to the cross section of the bars 25 and 26. The longitudinal passage 31 in the blocks 29 and 30 is alignable with the longitudinal passage 28 through the blocks 27 to thereby receive the bars 25 and 26.

A transverse passage 32 extends through each of the blocks 29 and 30 to receive the frame end members 10 and 11 respectively whereby the side members 5 and 6 are adjustable along the frame end members 10 and 11 for movement toward and away from the support members 14 and 15. The blocks 29 and 30 are suitably secured in selected lateral spacing, as by set screws.

The blocks 27 mounted between the blocks 29 and 30 may also each have a transverse passage 32 therethrough whereby the blocks 27, 29, and 30 may be interchangeable and only one type of modular block need be used in the assembly of the carrier side members 5 and 6.

The blocks 27, 29, and 30 of the side members 5 and 6 are each formed of mirror image halves 33 and 34 suitably secured together, as by bolts. The halves 33 and 34 have enlarged upper portions 35 and 36 respectively each having a longitudinally extending groove in facing surfaces to define the passages 28 and 31.

The halves 33 and 34 have lower portions 37 and 38 of reduced thickness thereby defining shoulders in facing surfaces to be engaged by an edge of one leg of support members 39 and 40 respectively. The support members 39 and 40 are illustrated as angles each having the one leg thereof in abutting engagement and having the other leg thereof extending beyond an exterior face of the lower portions 37 and 38 respectively thereby defining respective grooves or recesses in opposite faces thereof and each adapted to receive therein a respective side edge portion of the printed circuit board 2. The blocks 27, 29, and 30 are thereby reversible and interchangeable.

The side edge portions of the printed circuit boards may vary in thickness, therefore, the support members 39 and 40 are adjustably mounted on the respective lower portions 37 and 38 of the halves 33 and 34. In the illustrated embodiment, the one leg of the support members have slots 39' and 40' respectively to receive a suitable fastening member, such as bolts 27, for holding the support members 39 and 40 in clamped engagement between the lower portions 37 and 38.

The carrier end members 7 and 8 may be similar in construction to the blocks 27, 29, and 30. The carrier end members 7 and 8 may be one-piece blocks similar in overall shape to the blocks 27, 29, and 30 of the side members 5 and 6. The end members 7 and 8 have transverse passages 41 and 42 respectively therethrough corresponding in shape to the non-round shape of the center beam member 20 whereby the end members 7 and 8 are movable longitudinally along the center beam member 20 to adjust the spacing between the end members 7 and 8 to a spacing corresponding to the length of the printed circuit board 2. The leading end member, for example end member 7, is suitably secured in the selected position, as by a set screw.

The other or trailing end member 8 is maintained in engagement with the trailing end of the printed circuit board 2 by the resilient member 24 extending between the end member 8 and the enlarged portion or collar 23 of the center beam member 20.

The end members 7 and 8 have grooves 43 and 44 respectively adjacent lower edges of facing surfaces thereof to receive therein respective end edge portions of the printed circuit board 2. The grooves or recesses 43 and 44 are aligned with the grooves in the side members 5 and 6 as defined by the support members 39 and 40.

The conveyor engaging members 4 are mounted on each of the opposite ends of the end frame members 10 and 11 respectively. The conveyor engaging members 4 are illustrated as elongated members each having a transverse passage 45 therethrough of round cross section corresponding to the round cross section of the respective opposite end of the frame end members 10 and 11. The conveyor engaging members 4 are retained on the respective opposite ends of the frame end members 10 and 11 by a suitable keeper such as a collar, whereby the conveyor engaging members 4 are each rotatably mounted on a respective end of a respective one of the frame end members 10 and 11.

The keeper on each of the opposite ends of the frame end members 10 and 11 permit rotation of the conveyor engaging members and supports 4. Suitable fastening devices, such as nuts may be mounted on the opposite ends of the frame end members 10 and 11 to secure the supports 4 in a selected position relative to a conveyor or the support surface 9.

A pin or driving lug 46 extends from one side 46' of each of the conveyor engaging members 4, said side being adapted to rest on and be supported on a conveyor run with said pin on lug 46 removably received in respective portions of such conveyor (not shown). The conveyor engaging and support portions 4 each having a leg 47 extending from one end 47' thereof and adapted to engage the support surface 9 for supporting the carrier 1 and the circuit board 2 therein prior to, during, and after manufacture of the circuit board 2. The leg 47 is of such length that the support end thereof has a spacing from the respective frame end member that the lower part of the side members and board 2 are spaced above the support surface 9.

Each of the conveyor engaging and support members 4 has a recess 48 in the other end 48' thereof which is longitudinally aligned with the leg 47 of the respective conveyor engaging and support members 4. The recess 48 is adapted to receive therein a leg 47 of a like conveyor engaging member whereby the carrier 1 is stackable vertically with a plurality of like carriers. The length of the members 4 between the ends 47' and 48' is longer than the height of the side members to provide a selected vertical spacing between side members of stacked carriers.

In using a carrier for a printed circuit board constructed as illustrated and described, a selected number of blocks 27 are mounted on the bars 25 and 26 to determine the desired length of the carrier side members 5 and 6. The blocks 27, 29, and 30 are positioned in end-to-end abutting engagement and then clampingly secured to the respective bars 25 and 26. The conveyor side members 5 and 6 are then moved along the frame end members 10 and 11 to the desired spacing between the facing recesses defined by the support members 39 and 40. When in the desired position, the blocks 29 and 30 of each of the side members 5 and 6 are secured in place by the set screws. The carrier end member 8 is retracted compressing the spring until said end member is disengaged from the non-round portion of the beam 20 adjacent the connector member 15 permitting the end member 8 to be rotated on the end portion 22 to an inverted position. This opens the end for access so a printed circuit board 2 may be moved into the recesses in the carrier side members 5 and 6. The carrier end member 7 is moved longitudinally along the center beam member 20 to permit the entire circuit board 2 to be positioned between the end members 7 and 8. The end member 8 is then rotated to a position having the recess or groove 44 therein in alignment with the adjacent edge portion of the printed circuit board 2 and the spring moves said end member 8 into engagement with the connector member 14. The end member 7 is then moved toward the end member 8 until the circuit board 2 has all the peripheral sides and ends thereof supported on the side members 5 and 6 and the end members 7 and 8. The end member 7 is then moved further to space the end member 8 from the connector member 15 and compress the spring 24 to provide a desired clamping of the board between the end members 7 and 8. The end member 7 is then secured in place by the set screw. Thereafter, that sized board may be removed and applied to the carrier by retracting and rotating the end member 8 and sliding the boards in the recesses in the side members and returning the end member 8 to board clamping position. When it is desired to mount the carrier 1 and circuit board 2 on a conveyor (not shown), the pins 46 are inserted into respective portions of the conveyor and the sides 46' of the members 4 engaged therewith to support the carrier for movement with the conveyor. When the manufacture of the circuit board 2 is complete or an operation is finished and it is desired to store the carrier and circuit board, the carrier 1 is removed from the conveyor and the conveyor engaging and support members 4 are turned or rotated until the legs 47 thereof are in position to engage the support surface 9. Like carriers may be stacked vertically therewith by inserting the legs 47 thereof in the recesses 48 in the (now) upper ends 48' of the conveyor engaging members 4.

While a carrier has been illustrated for holding a single printed circuit board 2, it is to be understood that the carrier may be adapted to hold a second printed circuit board by mounting a second pair of leading and trailing connectors 14 and 15 on the frame end members 10 and 11 respectively. A beam member 20 would extend between the connectors 14 and 15 and carrier end members 7 and 8 mounted thereon. An additional carrier side member would be mounted on the frame 3 and spaced from one of the side members 5 and 6 to receive a second printed circuit board 2. It can be seen that the carrier could be expanded for multiple side-by-side printed circuit boards.

The transverse passage 45 through each of the conveyor engaging members 4 and the end portions of the frame end members 10 and 11 each being of round cross section permit the conveyor engaging members 4 each to turn on the respective end portions of the frame end members 10 and 11. The carrier 1, therefore, is adapted to travel from one conveyor (not shown) to another conveyor (not shown) when the two conveyors are in the same plane and when the two are positioned at different slopes, such as a valley with an upstream conveyor being inclined downwardly and a downstream conveyor being inclined upwardly or a crest with an upstream conveyor being inclined upwardly and a downstream conveyor being inclined downwardly.

It is to be understood that while I have illustrated and described one form of my invention, it is not to be limited to these specific forms or arrangement of parts herein described and shown.

What I claim and desire to secure by Letters Patent is:

1. A printed circuit board carrier comprising:
   a. a frame having a longitudinal beam and laterally extending leading and trailing elongated end members, said frame including connector members adjustably receiving said beam and end members to secure same relative to each other;
   b. support means mounted on said end members and adapted to engage a conveyor for movement of said frame thereby;
   c. carrier side members each having a plurality of block members connected together in longitudinal alignment and defining a length greater than a circuit board to be carried, certain of said block members receiving said end members for support thereon, said block members each having longitudinally extending grooves forming a lower ledge for receiving and supporting a circuit board side edge;
   d. means securing said certain blocks of said side members to said end members thereby positioning said side members in selected laterally spaced relation for the grooves therein to slidably receive and support the circuit board side edges;
   e. a first carrier end member adjustably mounted on said beam adjacent one end member; and
   f. a second carrier end member movably mounted on said beam, said first and second carrier end members having grooves to receive and support leading and trailing edges of the circuit board in gripping engagement in response to movement of said second carrier end member toward said first carrier end member.

2. A printed circuit board carrier as set forth in Claim 1 wherein said support means includes:
   a. an elongated member for and rotatably mounted on each end of each of said end members;
   b. a pin for and extending from one side of each of said elongated members and adapted to be received in respective portions of a conveyor;
   c. a leg for and extending from one end of each of said elongated members and adapted to engage a support surface; and d. means for and defining a recess in the other end of each of said elongated members and adapted to receive a respective leg therein whereby the carrier is stackable with like carriers.

3. A printed circuit board carrier as set forth in Claim 1 wherein:
   a. said frame end members are each elongated bars having a non-round cross section;
   b. said carrier side members each include:
      1. an elongated bar having a non-round cross section; and
      2. means for and defining a longitudinal passage through each of said block members and having a non-round cross section corresponding to the non-round cross section of said elongated bar whereby each of said block members are movable along said elongated bar; and
   c. each of said certain block members have means defining a transverse passage therethrough having a non-round cross section corresponding to the non-round cross section of said frame end members whereby said carrier side members are movable along said frame end members to a spaced apart position adapted to have the circuit board side edges supported thereon.

4. A printed circuit board carrier as set forth in Claim 1 wherein:
   a. each of said block members comprises:
      1. a pair of mirror image halves each having upper and lower edges and removably secured together with facing surfaces thereof in abutting engagement, said halves each having a reduced thickness portion adjacent the lower edges thereof;
      2. means in the facing surfaces of said halves defining respective longitudinally extending grooves positioned to define a passage through said block, said passage having a non-round shape;
      3. means in the facing surfaces of said halves defining respective longitudinally extending shoulders spaced from the lower edges thereof; and
      4. a pair of support members each having one portion thereof positioned between the facing surfaces of said halves and in engagement with a respective one of said shoulders and another portion thereof in engagement with a respective one of the lower edges of said halves and extending beyond the exterior surface of the reduced thickness portion thereby defining the respective longitudinally extending grooves; and
   b. said carrier side members each include an elongated bar having a non-round cross section corresponding to the non-round shape of the passage in each of said block members and adapted to be received therein whereby said block members are movable along said elongated bar.

5. A printed circuit board carrier comprising:
   a. support means including a frame having longitudinally spaced conveyor engaging portions;
   b. laterally spaced carrier side members adjustably mounted in said frame of said support means;
   c. means on each of said carrier side members for receiving and supporting a respective side edge portion of a printed circuit board,
   d. longitudinally spaced carrier end members adjustably mounted on said frame of said support means;
   e. means on each of said carrier end members for receiving and supporting a respective end edge portion of the printed circuit board;
   f. said frame of said support means including an elongated center beam member;
   g. said carrier end members being mounted on said center beam member of said frame and movable longitudinally therealong to be in engagement with the respective end edge portion of the printed circuit board.

6. A printed circuit board carrier comprising:
   a. support means including a frame having longitudinally spaced conveyor engaging portions;
   b. laterally spaced carrier side members adjustably mounted on said frame of said support means;
   c. means on each of said carrier side members for receiving and supporting a respective side edge portion of a printed circuit board;
   d. longitudinally spaced carrier end members adjustably mounted on said frame of said support means;
   e. means on each of said carrier end members for receiving and supporting a respective end edge portion of the printed circuit board;
   f. said frame of said support means includes a pair of longitudinally spaced elongated frame end members extending between and having a respective one of said conveyor engaging portions on each end thereof;
   g. said frame of said support means includes an elongated center beam member extending between said longitudinally spaced elongated frame end members; and
   h. said carrier end members are mounted on said center beam member of said frame and movable longitudinally therealong to be in engagement with the respective end edge portion of the printed circuit board.

7. A printed circuit board carrier as set forth in claim 6 wherein:
   a. said carrier side members each extend longitudinally between said frame end members of said support means; and
   b. said carrier side members are each formed of a plurality of like blocks each being of equal longitudinal dimension and having at least one end edge thereof in abutting engagement with the facing end edge of an adjacent block.

8. A printed circuit board carrier as set forth in claim 6 wherein:
   a. said conveyor engaging portions are each rotatably mounted on a respective end of a respective one of said end members of said support means;
   b. said conveyor engaging portions each are elongated members and each have a pin extending from one side thereof and adapted to be received in respective portions of a conveyor;
   c. said conveyor engaging portions each have a leg extending from one end thereof and adapted to engage a support surface; and
   d. said conveyor engaging portions each have a recess in the other end thereof and adapted to receive a respective leg therein whereby the carrier is stackable with like carriers.

9. A printed circuit board carrier comprising:
   a. support means including a frame having longitudinally spaced conveyor engaging portions;
   b. laterally spaced carrier side members adjustably mounted on said frame of said support means;
   c. means on each of said carrier side members for receiving and supporting a respective side edge portion of a printed circuit board;

longitudinally spaced carrier end members adjustably mounted on said frame of said support means;

e. means on each of said carrier end members for receiving and supporting a respective end edge portion of the printed circuit board;

f. said frame of said support means includes an elongated center beam member having said carrier end members mounted thereon and movable longitudinally therealong to conform to the length of the printed circuit board; and g. one of said carrier end members is rotatably mounted on said center beam member of said frame to permit placing the printed circuit board in the carrier and removing same therefrom.

10. A printed circuit board carrier as set forth in claim 9 wherein:

a. said frame of said support means includes a pair of longitudinally spaced elongated frame end members extending between and having a respective one of said conveyor engaging portions on each end thereof;

b. a center connector member is mounted on each of said elongated frame end members of said frame and has a respective portion of said center beam member supported thereon;

c. the other of said carrier end members is positioned between said connector members and adapted to be secured in a selected position on said center beam member; and d. the rotatably mounted carrier end member is resiliently urged toward the other of said carrier end members to retain in gripping engagement leading and trailing edges of the circuit board.

11. A printed circuit board carrier comprising:

a. support means including a frame having longitudinally spaced conveyor engaging portions;

b. laterally spaced carrier side members adjustably mounted on said frame of said support means;

c. means on each of said carrier side members for receiving and supporting a respective side edge portion of a printed circuit board;

d. longitudinally spaced carrier and members adjustably mounted on said frame of said support means;

e. means on each of said carrier end members for receiving and supporting a respective end edge portion of the printed circuit board;

f. said carrier side members each include:

1. an elongated bar having a non-round cross section;

2. a plurality of like blocks each being of equal longitudinal dimension and having at least one end edge thereof in abutting engagement with the facing end edge of an adjacent block; and 3. a longitudinally extending passage through each of said blocks and having a non-round cross section corresponding to the cross section of said elongated bar whereby said blocks each are movable along said elongated bar;

g. said frame of said support means includes a pair of longitudinally spaced elongated frame end members extending between said conveyor engaging portions and each having a non-round cross section; and h. at least certain blocks of each of said carrier side members have a transverse passage therethrough and having a non-round cross section corresponding to the cross section of said elongated frame end members whereby said carrier side members are movable along said frame end members to a spaced apart position corresponding to the width of the printed circuit board supported thereon.

12. A printed circuit board carrier as set forth in claim 11 wherein each of said block members comprises:

a. a pair of mirror image halves each having upper and lower edges and removably secured together with facing surfaces thereof in abutting engagement, said halves each having a reduced thickness portion adjacent the lower edges thereof;

b. means in the facing surfaces of said halves defining respective longitudinally extending grooves positioned to define said passage through said block;

c. means in the facing surfaces of said halves defining respective longitudinally extending shoulders spaced from the lower edges thereof; and d. a pair of support members each having one portion thereof positioned between the facing surfaces of said halves and in engagement with a respective one of said shoulders and another portion thereof in engagement with a respective one of the lower edges of said halves and extending beyond the exterior surface of the reduced thickness portion thereby forming a lower ledge for receiving and supporting a circuit board side edge.

* * * * *